United States Patent
Bruckmann et al.

(10) Patent No.: US 6,545,452 B2
(45) Date of Patent: Apr. 8, 2003

(54) METHOD AND DEVICE FOR CONTROLLING A POWER CONVERTER VALVE THAT CAN BE TURNED OFF AND HAS AT LEAST TWO SERIES CIRCUITS

(75) Inventors: Manfred Bruckmann, Nürnberg (DE); Rainer Marquardt, Ottobrunn/Riemerling (DE); Rainer Sommer, Heroldsbach (DE)

(73) Assignee: Siemens Aktiengesellschaft (DE)

( * ) Notice: Subject to any disclaimer, the term of this patent is extended or adjusted under 35 U.S.C. 154(b) by 0 days.

(21) Appl. No.: 09/791,194

(22) Filed: Feb. 21, 2001

(65) Prior Publication Data

US 2001/0017783 A1 Aug. 30, 2001

Related U.S. Application Data

(63) Continuation of application No. PCT/DE99/02506, filed on Aug. 11, 1999.

(30) Foreign Application Priority Data

Aug. 24, 1998 (DE) .......................... 198 38 389

(51) Int. Cl.[7] .................................. B05F 1/40
(52) U.S. Cl. .................. 323/289; 323/284; 363/132
(58) Field of Search .................... 363/56.02, 56.04, 363/56.05, 56.12, 98, 132; 361/91.5, 91.7, 93.9, 56; 323/289, 283–285, 271, 225, 908; 327/310, 320, 434

(56) References Cited

U.S. PATENT DOCUMENTS

| | | | | |
|---|---|---|---|---|
| 5,559,656 A | * | 9/1996 | Chokhawala | 361/111 |
| 5,946,178 A | * | 8/1999 | Bijlenga | 361/91.5 |
| 5,962,012 A | * | 10/1999 | Lin et al. | 424/448 |
| 6,204,717 B1 | * | 3/2001 | Nagasu et al. | 327/318 |

FOREIGN PATENT DOCUMENTS

| | | |
|---|---|---|
| DE | 4428674 | 8/1994 |
| DE | 4428675 | 8/1994 |
| EP | 0690898 | 3/1993 |
| EP | 0666647 | 1/1995 |

* cited by examiner

Primary Examiner—Michael Sherry
Assistant Examiner—Gary L. Laxton
(74) Attorney, Agent, or Firm—Baker Botts LLP (57) ABSTRACT

Method and apparatus for controlling a turn-off power converter valve having at least two series connections. Each non-latching power semiconductor switch of this power converter valve has an active collector-emitter limiting circuit. When a rising edge of a drive signal that is provided arrives, a predetermined value of the reference limited voltage of the active collector-emitter limiting circuit is decreased to a low value and is increased to the predetermined value again during a turn-off operation. Using a switch-on command, it is possible to balance the voltage sharing on the non-latching power semiconductor switches of a turn-off power converter valve having at least two series connections.

19 Claims, 8 Drawing Sheets

PRIOR ART

METHOD AND DEVICE FOR CONTROLLING A POWER CONVERTER VALVE THAT CAN BE TURNED OFF AND HAS AT LEAST TWO SERIES CIRCUITS

This is a continuation of application No. PCT/DE99/02506, filed Aug. 11, 1999.

BACKGROUND OF THE PRESENT INVENTION

The present invention relates to a method and an apparatus for controlling a power converter valve having at least two turn-off, non-latching power semiconductor switches which are electrically connected in series and each have an active collector-emitter limiting circuit.

Turn-off, non-latching power semiconductor switches include, for example, Insulated Gate Bipolar Transistor (IGBT), bipolar Power Transistors (PTR), Metal Oxide Semiconductor Field Effect Transistor (MOSFFT) or Hard Driven Gate Off Thyristor (HD GTO). In contrast to the latching power semiconductor switches, for example, Gate Turn Off thyristor (GTO), MOS Control Thyristor (MCT) or thyristors, the non-latching power semiconductor switches constantly require a drive signal in order to remain reliably switched on or off. Only the IGBT will be described below as non-latching power semiconductor switch. However, the description is in no way intended to be restrictive.

Conventional IGBT components (modules) can be used to realize power converters in the MV range without modules being connected in parallel. If the voltage range and/or the power range of a power converter of this type-is intended to be increased, then it is appropriate to connect in series a plurality of IGBT modules per power converter valve. A power converter circuit of this type is referred to as a power converter having a series connection number of Two or more.

Figure 1:
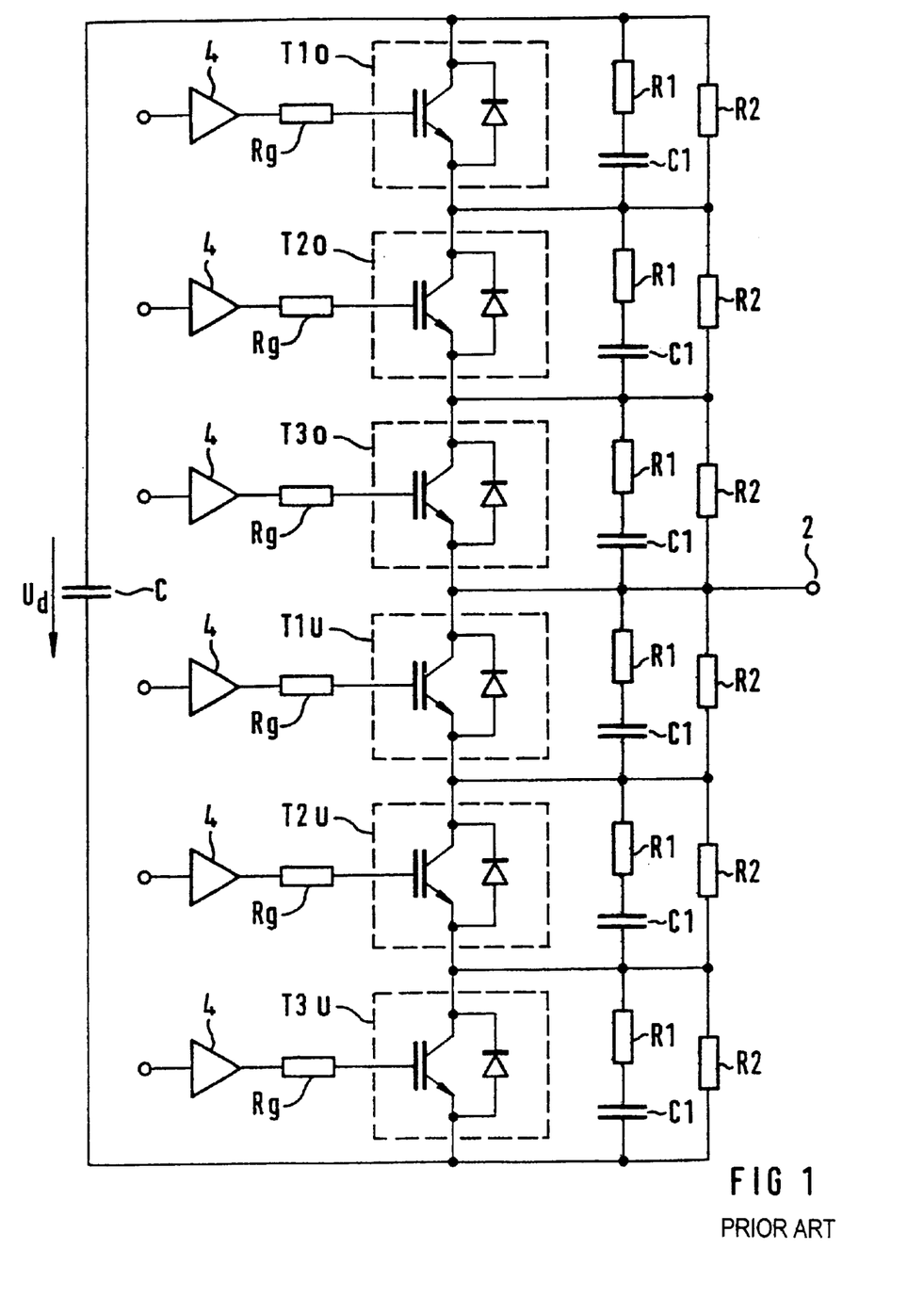
FIG. 1 shows a basic circuit diagram of a conventional power converter having three series connections.

FIG. 1 illustrates a basic circuit diagram of a power converter having three series connections of one phase of a polyphase power converter. This bridge circuit has three upper and three lower power semiconductor switches T1o, T2o, T3o and T1u, T2u, T3u which are electrically connected in series. The junction points between the upper and lower power semiconductor switches T1o, T2o, T3o and T1u, T2u, T3u form a phase terminal 2. On the input side, this phase power converter is linked to an intermediate circuit capacitor C which stabilizes the intermediate circuit DC voltage $U_d$. An RC snubber, which includes a capacitor C1 and a resistor R1 and a balancing resistor R2, is electrically connected in parallel with each power semiconductor switch T1o, T2o, T3o and T1u, T2u, T3u. Each power semiconductor switch T1o, T2o, T3o and T1u, T2u, T3u has a control apparatus, of which only a driver stage 4 with a gate resistor Rg connected downstream is illustrated here for reasons of clarity. Each of these apparatuses also has an active collector-emitter limiting circuit. A phase power converter of this type is described in the publication entitled "High Power IGBT Converters with new Gate Drive and Protection Circuit", printed in EPE'95, pages 1.066 to 1.070.

The RC snubber in each case minimizes the effect of nonlinear depletion-layer capacitances of the IGBT with internal inverse diode. Uniform static voltage sharing is achieved using the balancing resistors R2. The active collector-emitter limiting circuits of each stage limit the maximum voltage for each IGBT module T1o, T2o, T3o, T1u, T2u, T3u below the permissible blocking voltage.

In contrast to the power converter having the series connection number of One, in the case of a power converter having at least two series connections, the possible voltage potentials of the individual semiconductor switches are not fixedly predetermined a priori.

Figure 2:
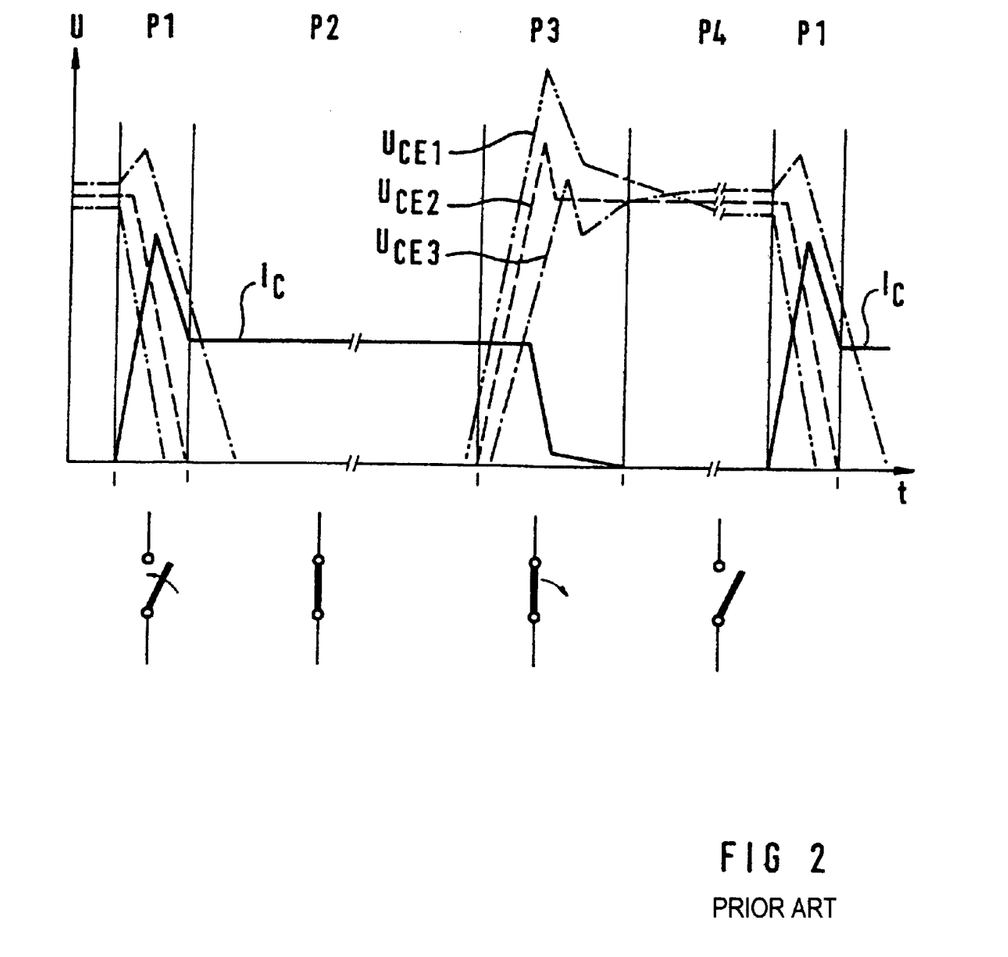
FIG. 2 shows voltage profiles of different operating states of the collector-emitter voltages of the power semiconductor switches which are electrically connected in series as shown in FIG. 1 plotted against time t.

FIG. 2 illustrates, by way of example, voltage profiles of the collector-emitter voltages $U_{CE1}$, $U_{CE2}$, $U_{CE3}$, for example of the power semiconductor switches T1o, T2o, T3o, during the phases "switch-on" P1, "on state" P2, "switch-off" P3 and "off state" P4, against the time t.

Figure 3:
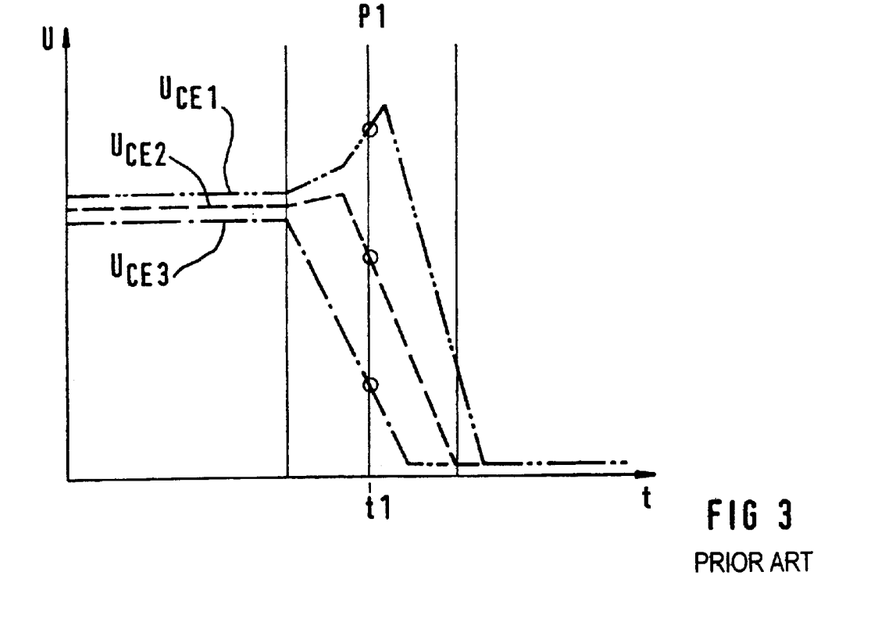
FIG. 3 shows the voltage profiles of the power semiconductor switches which are electrically connected in series during switch-on, plotted against time t.
Figure 4:
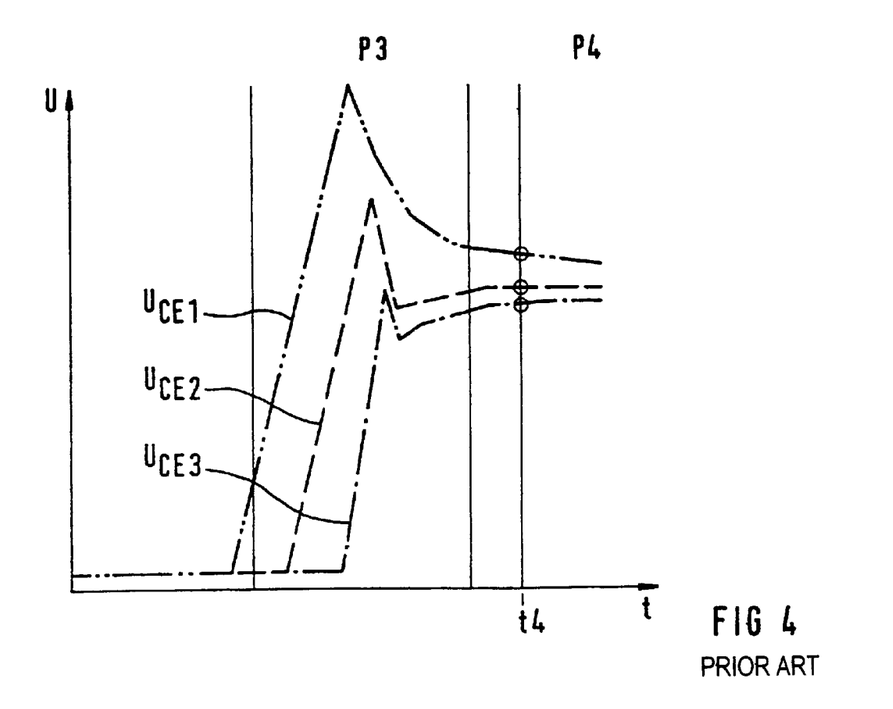
FIG. 4 shows the voltage profiles of the power semiconductor switches which are electrically connected in series during switch-off plotted against time t.

During the switch-on and -off phases P1 and P3, respectively (as shown in FIG. 3 and FIG. 4, respectively), primarily semiconductor-inherent properties such as, e.g., differences with regard to storage charge and depletion-layer capacitance, different delays and switch-on and off times determine the voltage distribution, but differences in driving as a result of tolerance, jitter- and drift-encumbered signal propagation times and also properties in the load circuit (control inductances, stray and ground capacitances and additional snubbers) also have a non-negligible influence. As shown in FIG. 3, an instant t1 is marked which demonstrates the appearance of the voltage distribution on the series connected power semiconductor switches T1o, T2o, T3o during the switch-on phase P1 at this instant t. This diagram shown in FIG. 3 illustrates that the power semiconductor switch T1 o takes up the greatest part of the reverse voltage.

During the off-state phase P4 (shown in FIG. 4), the voltage sharing is not stable but rather depends on the preceding switch-off operation, the turned-off current and on the magnitude, tolerance and drift of the leakage current and also on a snubber. After a period of time which depends on the depletion-layer and snubber capacitances, the leakage currents lead to a non-uniform steady-state voltage sharing in which, in the worst-case situation, a single power semiconductor switch has to take up the entire reverse voltage. The instant t4 shown in FIG. 4 illustrates a moment of a voltage distribution in the switched-off state (phase P4).

European Patent No. 0 653 830 describes a method and apparatus for driving a power converter having three series connections, with which the problems evinced are solved. With this conventional method, the collector-emitter voltages of the turn-off, non-latching power semiconductor switches which are electrically connected in series, and the total voltage present across the series circuit are measured. From an n-th part of the total voltage and a respective collector-emitter voltage, a respective differential voltage is determined, from which switch-on and switch-off times are then calculated. Using a delay circuit and these switch-on and switch-off times, the time switching points of a control signal that is provided are determined for each power semiconductor switch of the series circuit. The switch-on and switch-off times and the switching instants of a control signal are calculated in such a way that all the power semiconductor switches of the series circuit are loaded identically, in voltage terms. In the switched-off state of the power semiconductor switches which are electrically connected in series, the magnitude of the individual control signals is in each case calculated from the measured collector-emitter voltages, with the aid of an n-th part of the total voltage, in such a way that an identical voltage loading results in the off state for all of the switches. These calculated switching instants are implemented only during the subsequent switching operation.

European Patent Application No. 0 666 647 describes a method and circuit arrangement for driving semiconductor switches of a series circuit, each semiconductor switch being assigned a voltage limiting apparatus. Using this known method, the power loss of each voltage limiting apparatus is detected by a regulating device for evening out the voltage sharing over the semiconductors. The regulating device generates modified control pulses for each semiconductor switch from a common control pulse on the basis of the detected power losses of the voltage linking apparatuses. As a result, the power loss of the voltage limiting apparatuses is regulated to a minimum. This European published patent application specifies an embodiment in which an RCD snubber, balancing resistors and short-circuit elements are electrically connected in parallel with each semiconductor switch. The RCD snubber protects the IGBT module against overvoltage sparks during the turn-off of the load current. The balancing resistors provide for steady-state voltage sharing and the short-circuit elements, for example avalanche diodes or varistors, take over the current flow if the modules fail and the module voltage exceeds the response threshold of the voltage limiting apparatus and the higher response threshold of the short-circuit elements.

In both of the conventional methods, balanced voltage sharing is achieved by shifting switching instants of a control signal that is provided. This balancing of the voltage sharing in the case of a turn-off power converter valve having at least two series connections is effected statically and not dynamically since a discrete-time method is involved, e.g., the switching times are calculated from the measured actual values in a switching operation, and said switching times are only implemented in the subsequent switching operation. Consequently, an operating state that has already occurred is subsequently altered in a stepwise manner.

SUMMARY OF THE INVENTION

The present invention is based on the object of specifying a method and an apparatus for controlling a power converter valve having at least two turn-off, non-latching power semiconductor switches which are electrically connected in series, with which it is possible to achieve dynamic balancing of the voltage sharing in the power converter valve.

By virtue of the fact that when a rising edge of a drive signal is received, a changeover is made from a predetermined value of a reference limiter voltage to a lower value, the effect achieved is that the voltages of the individual power semiconductor switches which are electrically connected in series are balanced using the switch-on command to a range which guarantees that the switch-on energy losses are evened out. During the turn-off operation, the value of the reference voltage is increased again to the predetermined value in order that these power semiconductor switches are protected, in the switched-off state, against voltage spikes from a supply network.

The configuration of the apparatus according to the present invention for controlling a series circuit comprising a plurality of turn-off, non-latching power semiconductor switches is dependent on the configuration of the active collector-emitter limiting circuit used.

If a clamping snubber having at least two transit diodes is used as the collector-emitter limiting circuit, then at least one transil$^r$ diode can be bridged by means of a switch. The switch is closed in a manner dependent on the rising edge. If a differential amplifier with a reference voltage source is used as the active collector-emitter limiting device, then a second reference voltage source is used, which can be connected to the reference input of the differential amplifier by means of a changeover switch. The changeover switch is actuated in a manner dependent on the rising edge of a drive signal that is provided. The second reference voltage source supplies a reference limiter voltage having a lower value.

Another advantageous possibility according to the present invention is that when a differential amplifier with a reference voltage source is used, provision is made of a controllable current source which can be linked on the output side to an actual value input of the differential amplifier. In a manner dependent on the rising edge of a drive signal that is provided, the controllable current source is connected on the output side to the actual value input of the differential amplifier. As a result, the actual value of the collector-emitter voltage is processed in such a way that a differential value is determined which is equal to a differential value of an unchanged actual value and a reduced value of a reference limiter voltage.

With these three above-described apparatuses for controlling a series circuit comprising a plurality of power semiconductor switches, the voltages of the individual power semiconductor switches are balanced by means of the switch-on command immediately rather than first during the subsequent switching operation. This is also achieved without a high outlay. Moreover, it is possible to modify any commercially available drive device which has one of the three aforementioned embodiments of an active collector-emitter limiter circuit according to the present invention.

In an advantageous method of the present invention, in the switched-off state after a predetermined time interval after the ending of the turn-off operation, the predetermined reference limiter voltage is cyclically decreased by a predetermined value for a predetermined time interval. As a result, an unbalanced voltage sharing that has arisen on account of different reverse currents and/or different tail currents is balanced.

In other words, the static balancing is likewise effected actively via the driving method. Consequently, it is possible to dispense with the balancing resistors.

In a further advantageous embodiment of the method according to the present invention, in the switched-off state after a predetermined time interval after the ending of the turn-off operation, a determined gate-emitter voltage is compared with a predetermined gate-emitter reference voltage in such a way that when the gate-emitter reference voltage is exceeded, the predetermined value of the reference limiter voltage is decreased by a predetermined value. The static balancing is likewise achieved actively by means of this further advantageous method.

The cyclic method is a prophylactic measure in order to achieve static balancing in the switched-off state. The advantageous further method takes effect only when unbalancing occurs, which can be determined by means of the gate-emitter voltage. Consequently, the value of the predetermined reference limiter voltage is decreased when and only when erroneous distribution of voltage occurs.

In a yet further advantageous embodiment of the method according to the present invention, the cyclic redaction of the value of the reference limiter voltage in the case of a series circuit comprising a plurality of power semiconductor switches is carried out in a manner staggered over time from switch to switch. This staggering over time prevents the blocking capability of the series circuit from being significantly reduced.

BRIEF DESCRIPTION OF THE DRAWINGS

For further explanation of the present invention, reference is made to the drawings, in which a plurality of exemplary embodiment of the apparatus for controlling a power converter valve having at least two power semiconductor switches which are electrically connected in series are illustrated schematically.

DETAILED DESCRIPTION

Figure 5:
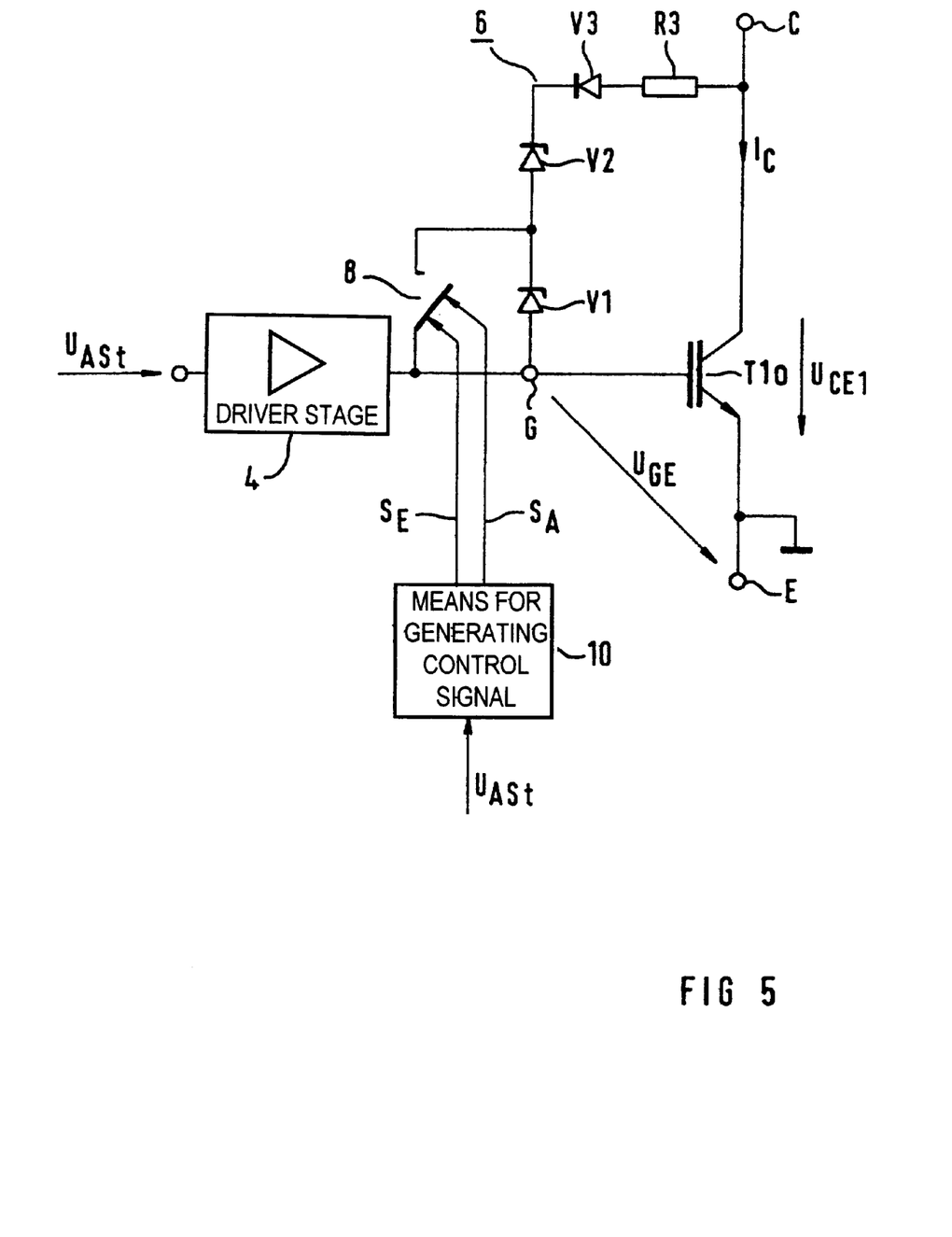
FIG. 5 shows a first embodiment of an apparatus according to the present invention for controlling a power converter valve having at least three series connections as shown in FIG. 1.

FIG. 5 illustrates a first embodiment of the apparatus according to the present invention for controlling a turn-off, non-latching power semiconductor switch T1o of a power converter valve having three series connections as shown in FIG. 1. The other two power semiconductor switches T2o and T3o of this power converter valve having three series connections are not illustrated in FIG. 5 for the sake of clarity. However, each turn-off, non-latching power semiconductor switch T1o, T2o, T3o and T1u, T2u, T3u of a power converter valve having three series connections as shown in FIG. 1 has an apparatus according to the present invention as illustrated in this FIG. 5.

In this first embodiment, a clamping snubber 6 is provided as the active collector-emitter limiter circuit. This clamping snubber 6 is connected between a collector terminal C and a control terminal G of the power semiconductor switch T1o. This clamping snubber a has at least two zener diodes V1, V2, a decoupling diode V3 and a current limiting resistor R3. The zener diodes V1 and V2 are also referred to as transit diodes. These transit diodes V1 and V2 are dimensioned in such a way that the peak voltage $U_{CE}$ present during interference-free switching operation is lower than the breakdown voltage of the power semiconductor switch T1o. If the collector-emitter voltage $U_{CE1}$ of the power semiconductor switch T1o approximately reaches the breakdown voltage for some reason during switch-off, then the transil$^r$ diodes V1 and V2 respond and a steady-state current flows through these transit diodes V1 and V2. The current is limited by the current limiting resistor R3 This steady-state current flow between collector terminal C and control terminal of the power semiconductor switch T1o drives the latter to an extent such that the collector-emitter voltage $U_{CE1}$ is equal to the sum of the zener voltages of the transil$^r$ diodes V1 and V2. German Patent Application Nos. 44 28 675 and 44 28 674 describe in detail a clamping snubber 6 as active collector-emitter limiter circuit and advantageous developments thereof, accordingly description of this clamping snubber 6 is not provided herein.

According to the present invention, at least one transit diode V1 and/or V2, and in this exemplary case the transit diode V1, can be bridged using a switch 8. A control signal $S_E$, $S_A$ derived from a drive signal $U_{AST}$ that is provided is present at the control input of said switch 8. This switch 8 is closed using the control signal $S_E$ in a manner dependent on the, rising edge. As a result, the value of the reference limiter voltage $U_{CEref}$ is reduced in jumps. The more transil$^r$ diodes V1, V2 are used, in the case of a clamping snubber 6 of this type, the more finely stepped becomes the reduction of the value of the reference limiter voltage $U_{CEref}$ for the collector-emitter voltage $U_{CE1}$ of the power semiconductor switches T1o. The switch 8 is opened again using a control signal $S_A$. This control signal $S_A$ is derived from the falling edge of the drive signal $U_{Ast}$ that is provided This generation of the control signals $S_E$ and $S_A$ is effected using a device 10, whose details depend on the choice of switch 8.

Figure 6:
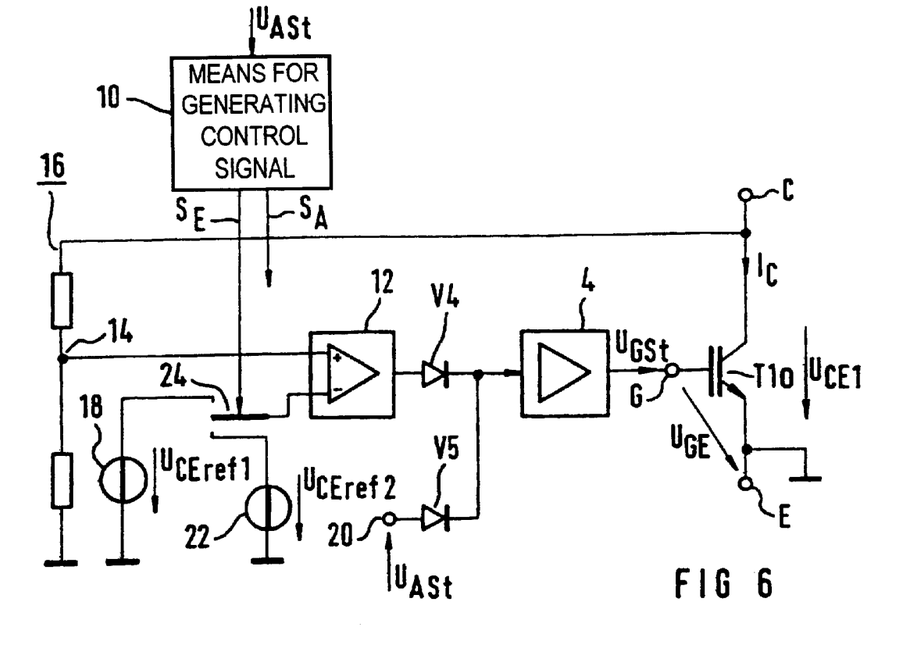
FIG. 6 shows a second embodiment of the apparatus according to the present invention for controlling a power converter valve having at least three series connections as shown in FIG. 1.

A second embodiment of the apparatus according to the present invention is illustrated in more detail in FIG. 6. In this embodiment, a differential amplifier 12 is provided as the active collector-emitter limiting circuit. The actual value input "+" of this differential amplifier 12 is linked to an output 14 of a voltage divider 16, one end of which is connected to the collector terminal C of the power semiconductor switch T1o and the other end of which is connected to a reference-ground potential (ground potential). The reference input "−" of the differential amplifier 12 is connected to a reference voltage source 18, which supplies a predetermined reference limiter voltage $U_{CEref1}$. On the output side, this differential amplifier 12 is linked by means of a decoupling diode V.P. to a signal input of the downstream driver stage 4. A control input 20 is likewise connected to the signal input of the downstream driver stage 4 by means of a decoupling diode V5. An embodiment of this drive apparatus is illustrated and described in detail in European Patent No. 0 690 898.

According to the present invention, a second reference voltage source 22 is provided, which supplies a reduced reference limiter voltage $U_{CEref2}$. On the output side, this reference voltage source 22 is connected to an input of a changeover switch 24, to whose second input the output of the reference voltage source 18 is connected. On the output side, this changeover switch 24 is linked to the reference input "−" of the differential amplifier 12.

Figure 7:
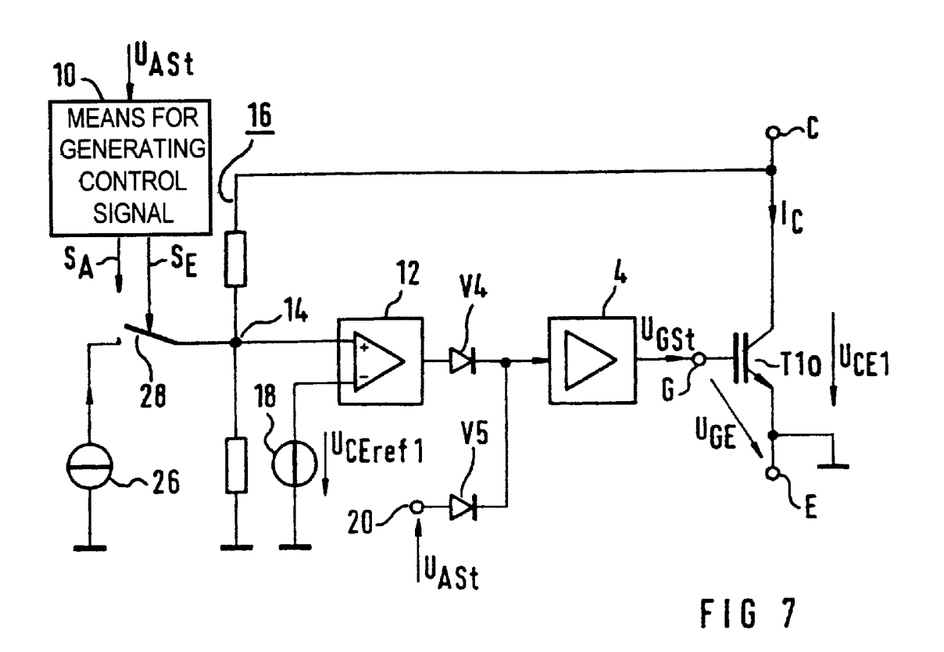
FIG. 7 shows a third embodiment of the apparatus according to the present invention for controlling a power converter valve having at least three series connections as shown in FIG. 1.

A further embodiment of the apparatus according to the present invention for controlling a power converter valve having at least two series connections is illustrated in FIG 7. In this embodiment, a differential amplifier 12 with a voltage divider 16 and a reference voltage source 18 is used as the active collector-emitter limiter circuit. This further embodiment differs from the embodiment shown in FIG. 6 in that, instead of a second reference voltage source 22 and a changeover switch 24, a controlled current source 26 is provided, which can be connected on, the output side to the output 14 of the voltage divider 16 by means of a switch 28. The control signals $S_E$ and $S_A$ of the switch 28 are likewise generated by means of the device 10 from a drive signal Uast that is provided, The value of the reference limiter voltage $U_{CEref1}$—of the reference voltage source 18 can be reduced as desired by means of the controlled current source 26.

Instead of a reference voltage source 18, it is also possible to provide a further voltage divider which divides the intermediate circuit DC voltage $U_d$ (see FIG. 1) down to a predetermined reference limiter voltage $U_{CEref1}$. Likewise, the reference limiter voltage $U_{CEref2}$ can be generated using this voltage divider, in which case a further voltage divider output can be connected to the reference input "−" of the differential amplifier 12 using the changeover switch 24.

The method of operation of the apparatus as shown in FIG. 6 is explained in more detail with reference to FIGS. 8–13.

When a rising edge of a drive signal $U_{ASt}$ that is provided arrives at the instant t1, using a control signal $S_E$ the reference input of the differential amplifier 12 is linked to the output of the reference voltage source 22 instead of to the output of the reference voltage source 18. As a result of this changeover operation, the value of the predetermined reference limiter voltage $U_{CEref1}$ at the reference input of the differential amplifier 12 is immediately reduced to the reduced value of the reference limiter voltage $U_{CEref2}$. Consequently, the active collector-emitter limiter circuit has a new, smaller desired value which is used for regulating the collector-emitter voltage $U_{CE1}$ during switch-on. This jump-like reduction of the reference limiter voltage $U_{CEref}$ from the value $U_{CEref1}$ to the lower value $U_{CEref2}$ results in a considerable reduction in the switch-on losses at the relevant power semiconductor switch T1o. Moreover, the voltages $U_{CE1}$, $U_{CE2}$ and $U_{CE3}$; of the series-connected power semiconductor switches T1o, T2o and T3o of the turn-off power converter valve as shown in FIG. 1 are balanced using the switchon command to a range which guarantees that the switch-on losses are evened out.

Figure 13:
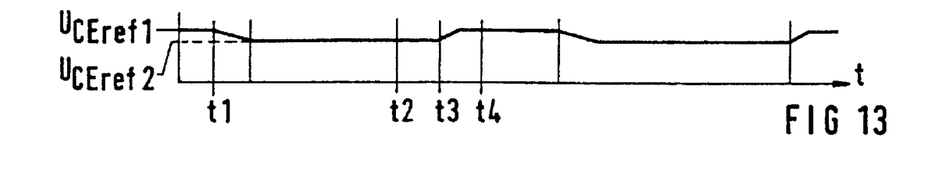
FIG. 13 shows a sixth relevant signal profile of the apparatus according to the present invention plotted against time t.
Figure 14:
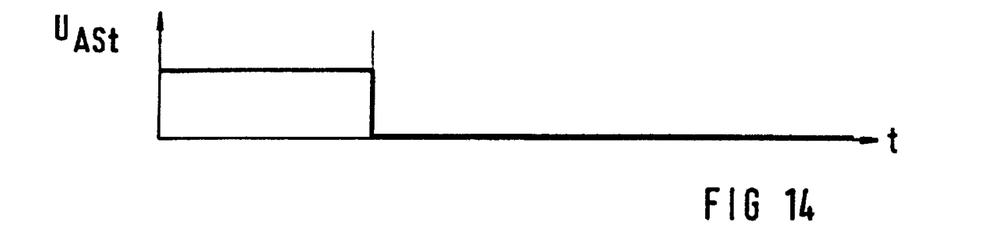
FIG. 14 shows a first signal profile of the method according to the present invention plotted against time t.

It is advantageous, as illustrated in FIG. 13, to accomplish the change from the predetermined value $U_{CEref1}$ of the reference limiter voltage $U_{CEref}$ to a reduced value $U_{CEref2}$ of the reference limiter voltage $U_{CEref}$ not in jumps but by means of a time function (ramp). This dynamic precontrol enables instances of dynamic unbalancing to be reduced, as a result of which the switch-on losses at the individual power semiconductor switches T1o, T2o, T3o and T1u, T2u, T3u of the turn-off power converter valve as shown in FIG. 1 are significantly reduced.

After the value $U_{CEref1}$ of the reference limiter voltage $U_{CEref}$ has been reduced to the value $U_{CEref2}$ of the reference limiter voltage $U_{CEref}$, the switch-on phase proceeds in a known fashion.

Figure 8:
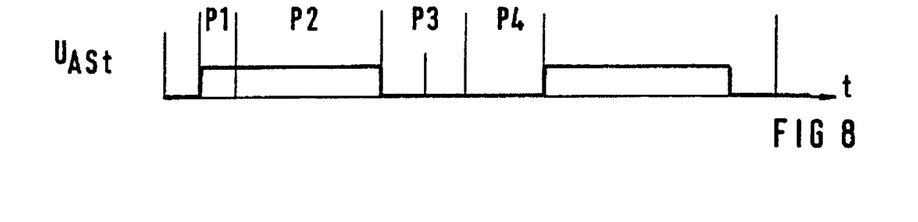
FIG. 8 shows a first relevant signal profile of the apparatus according to the present invention plotted against time t.
Figure 9:
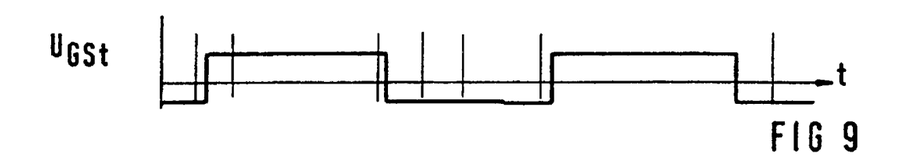
FIG. 9 shows a second relevant signal profile of the apparatus according to the present invention plotted against time t.

At the instant t2, the drive signal $U_{ASt}$ (as shown in FIG. 8) that is provided has a falling edge. This falling edge initiates the turn-off operation. At the instant t3, the reduced reference limiter voltage $U_{CEref2}$ is increased again to the predetermined reference limiter voltage $U_{CEref}$. This increase also advantageously occurs in a time-dependent manner. In this case, dynamic unbalances are reduced as a result. The reference limiter voltage $U_{CEref}$ should therefore be increased in order that, in the off state, the power semiconductor switch T1o is protected against overvoltages from the applied input voltage.

Figure 10:
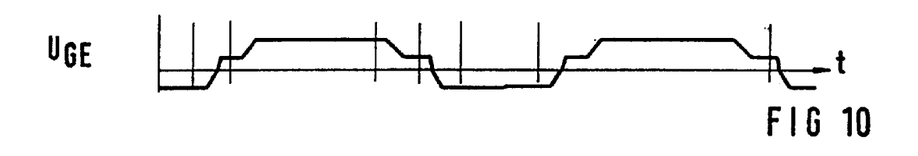
FIG. 10 shows a third relevant signal profile of the apparatus according to the present invention plotted against time t.
Figure 11:
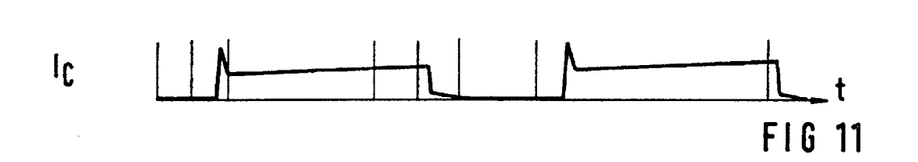
FIG. 11 shows a fourth relevant signal profile of the apparatus according to the present invention plotted against time t.
Figure 12:
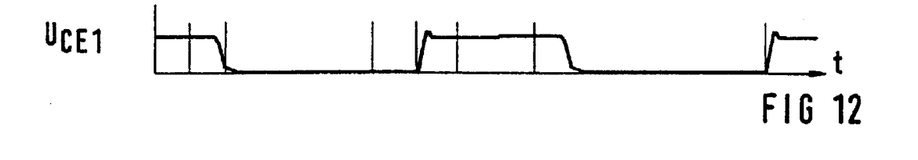
FIG. 12 shows a fifth relevant signal profile of the apparatus according to the present invention plotted against time t.

The increasing of the reference limiter voltage $U_{CEref}$ should begin when the highly dynamic part of the turn-off operation begins. This instant is reached as soon as the power semiconductor switch desaturates. At this instant, the gate-emitter voltage $U_{GE}$ has fallen to the plateau voltage (as shown in FIG. 10). The instant t3 can likewise be determined with a predetermined period of time which is started when the falling edge of the drive signal $U_{ASt}$ that is provided arrives.

The method of operation of the apparatus as shown in FIG. 7, with which an advantageous method according to the present invention is carried out, is explained in more detail with reference to FIGS. 14–17.

Figure 15:
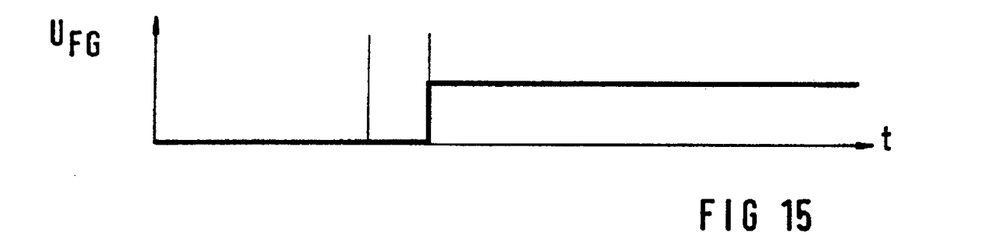
FIG. 15 shows a second signal profile of the method according to the present invention plotted against time t.
Figure 16:
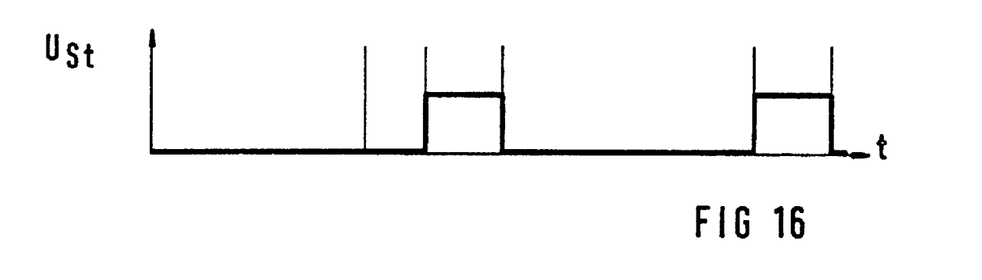
FIG. 16 shows a third signal profile of the method according to the present invention plotted against time t.
Figure 17:
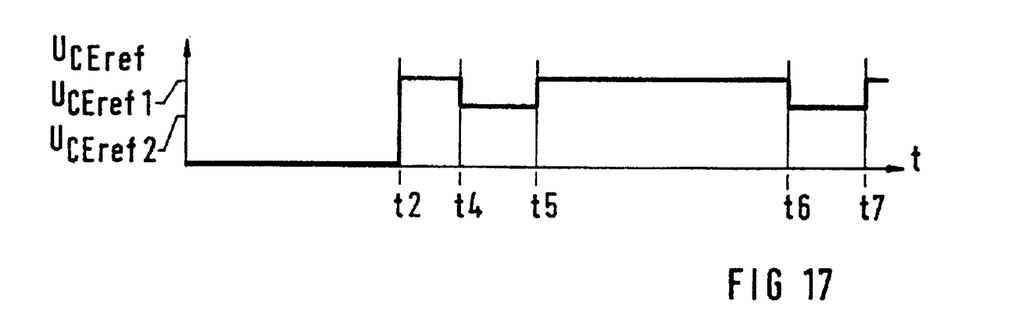
FIG. 17 shows a fourth signal profile of the method according to the present invention plotted against time t.

On the input side, it has been pointed out that on account of various residual currents of the power semiconductor switches T1o, T2o and T3o, and T1u, T2u and T3u, which are electrically connected in series, unbalanced T3u voltage sharing is established, which can have an adverse effect during the next switch-on operation. In order to balance this unbalanced voltage sharing in the off state of the power converter valve having a series connection number of Three, the controllable current source 26 that can be connected in is connected in, in a temporally cyclic manner during the off phase of the power semiconductor switch T1o or T2o or T3o, to the signal input "+" of the differential amplifier 12. The controlled current source 26 is connected in a temporally cyclic manner in this way only when a predetermined time interval t4–t2 has elapsed after the arrival of the falling edge of the drive signal $U_{ASt}$ that is provided. When this time interval t4–t2 has elapsed, the temporally cyclic decreasing of the reference limiter voltage $U_{CEref}$ is enabled (as shown in FIG. 15). With the beginning of the enable signal $U_{FG}$, the predetermined value $U_{CEref1}$ of the reference limiter voltage $U_{CEref}$ is decreased to a low value $U_{CEref2}$ (as shown in FIG. 17) for a predetermined time t5–t4 (as shown in FIG. 16). Afterward, the value of the reference limiter voltage $U_{CEref}$ rises back to the original value $U_{CEref}$. This operation is repeated at the instant t6. In other words, the time period t6–t4 produces the period duration of this temporally cyclic decreasing of the reference limiter voltage $U_{ceref}$.

In an advantageous method of the cyclic reduction of the reference limiter voltage $U_{CEref}$, this cyclic reduction is carried out in a manner staggered over time from power semiconductor switch to power semiconductor switch in the case of the power semiconductor switches T1o, T2o, T3o and T1u, T2u, T3u, which are electrically connected in series, of the turn-off power converter valve as shown in FIG. 1. This cyclic reduction staggered over time prevents the blocking capability of the turn-off power converter valve as shown in FIG. 1 from, being significantly reduced.

The advantage of this temporally cyclic or temporally staggered temporally cyclic decreasing of the reference limiter voltage $U_{CEref}$ is that it is possible to dispense with the balancing resistors R2 (FIG. 1) for static voltage balancing.

Figure 18:
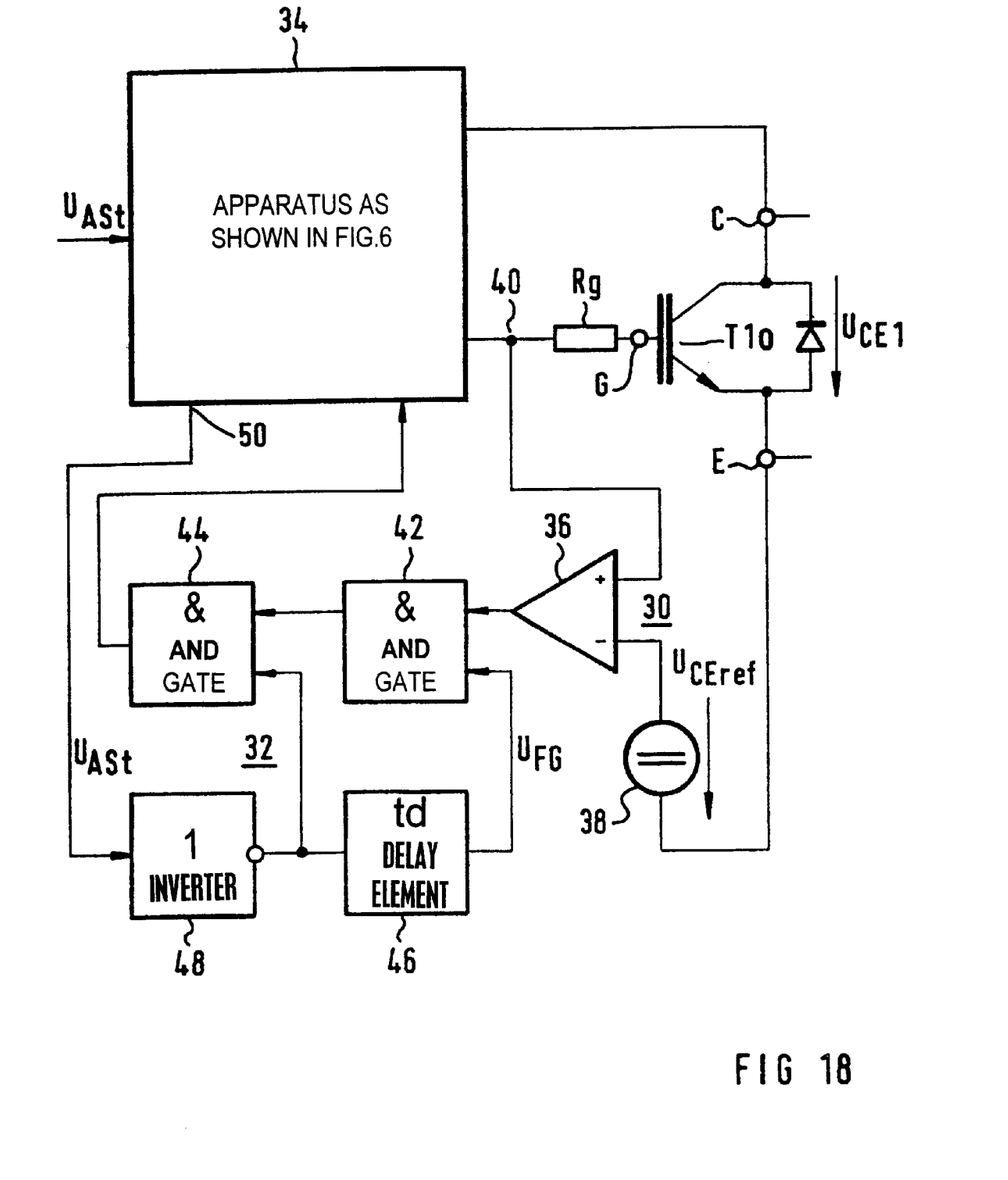
FIG. 18 shows an advantageous embodiment of the apparatus according to the present invention for controlling a power converter valve having at least two series connections.

FIG. 18 shows a further advantageous apparatus for controlling a power converter valve having three series connections as shown in FIG. 6. This embodiment differs from the embodiment shown in FIG. 6 in that a gate-emitter monitoring device 30 and a logic circuit 32 are additionally provided. The apparatus as shown in FIG. 6 is integrated in the block 34.

The gate-emitter monitoring device 30 has a differential amplifier 36 and a reference voltage source 38. This reference voltage source 38 is linked to the emitter terminal E of the power semiconductor switch T1o at one end and to the inverting input of the differential amplifier 36 at the other end. The non-inverting input of this differential amplifier 36 is connected to the output-40 of the block 34.

The logic circuit 32 has two AND gates 42, 44, a delay element 46 and an inverter 48. A signal output 50 of the block 34, at which the drive signal $U_{A,st}$ that is provided is present, is connected to the input of the inverter 48, whose output is linked to the delay element 46, on the one hand, and to a first input of the second AND gate 44, on the other hand. On the output side, the delay element 46, whose delay time td is adjustable, is connected to a first input of the first AND gate 42. The second input of this AND gate 42 is, linked to the output of the differential amplifier 36, the output of the AND gate 42 being connected to the second input of the second AND gate 44. The delay time td is set in such a way that an enable signal UFG as shown in FIG. 15 is present at the instant t4.

At the output of the inverter 48, the state changes from low to high as soon as the falling edge of the drive signal $U_{ASt}$ that is provided arrives. According to FIG. 14, this is at the instant t2. This high signal is delayed by means of the delay element 46 until the instant t4 (FIG. 15). After this instant t4, a high signal is present in each case at the first input of the cascaded AND gates 42, 44. If the gate-emitter voltage $U_{GE}$ exceeds the predetermined gate-emitter reference value $U_{GEref}$ in the off state of the power semiconductor switch T1o, then the output of the differential amplifier 36 changes its state from low to high. With this state change of the differential amplifier 36, the states of the outputs of the two AND gates 42 and 44 change as well. Consequently, a high signal is present at the output of the second AND gate 44, and is fed to the block 34. This high signal effects the reduction in the predetermined reference limiter voltage $U_{CEref}$.

This circuit becomes active only when unbalanced voltage sharing occurs during an off state of the power semiconductor switch T1o. The apparatus as shown in FIG. 7 with the temporally cyclic decreasing of the reference limiter voltage $U_{CEref}$ is a prophylactic measure and is active during the entire off state of the power semiconductor switch T1o.

In the case of a diode series circuit, as is present in a chopper circuit for example, a low-power turn-off power converter valve is electrically connected in parallel with the diode series circuit. In this case, the power converter valve has a number—corresponding to the number of diodes—of non-matching power semiconductor switches which are electrically connected in series.

The effect achieved by the method according to the present invention is that balanced voltage distribution is established at the diode series circuit. Reliable overvoltage protection for the diodes of the diode series circuit is achieved by this circuit arrangement and the method according to the present invention.

We claim:

1. A method for controlling a power converter valve having at least two turn-off non-latching power semiconductor switches which are electrically connected in series, each of the semiconductor switches having an active collector-emitter limiting circuit with a predetermined reference limiter voltage value, the method comprising the steps of (a) when a rising edge of a drive signal arrives, performing a changeover from the predetermined reference limiter voltage value to a lower value; and (b) performing a changeover back to the predetermined reference limiter voltage value during a turn-off operation.

2. The method according to claim 1, further comprising the step of cyclically decreasing the predetermined reference limiter voltage value to the lower value for a predetermined time interval in a switched-off state, after a predetermined time interval, and after a completion of the turn-off operation.

3. The method according to claim 1, further comprising the step of comparing a predetermined gate-emitter voltage to a predetermined gate-emitter reference voltage wherein, when the gate-emitter reference voltage is exceeded, the predetermined reference limiter voltage value is decreased to the lower value in a switched-off state, after a predetermined time interval, and after a completion of the turn-off operation.

4. The method according to claim 1, wherein the switchover from the predetermined reference limiter voltage value to the lower value is carried out in a manner staggered over time in the case of the power semiconductor switches of the turn-off power converter valve which are electrically connected in series.

5. The method according to claim 1, wherein step (b) is performed when a respective one of the turn-off, non-latching power semiconductor switches desaturates.

6. The method according to claim 1, wherein step (b) is performed when the value of a determined gate-emitter voltage has fallen to the value of a plateau voltage.

7. The method according to claim 1, wherein step (b) is performed when a predetermined waiting time has elapsed.

8. The method according to claim 1, wherein the value of the reference limiter voltage is decreased to the lower value in such a way that the active collector-emitter limiting circuit of the turn-off, non-latching power semiconductor switches of the turn-off power converter valve which are electrically connected in series responds.

9. The method according to claim 1, wherein the predetermined reference limiter voltage value is decreased continuously to a lower value of the reference limiter voltage.

10. The method according to claim 1, wherein step (b) is performed continuously.

11. The method according to claim 1, wherein the lower value of the reference limiter voltage is derived from a determined intermediate-circuit DC voltage.

12. An apparatus for controlling a turn-off power converter valve having at least two turn-off, non-latching power semiconductor switches which are electrically connected in series, each of the conductor switches comprising a driver stage and a clamping snubber to form an active collector-emitter limiting circuit; at least one transit diode; and a switch including a control input and capable of bridging the at least one transit diode, wherein the clamping snubber is connected between a collector terminal and a control terminal of the respective power semiconductor switch, wherein the driver stage is linked to an output side to a gate terminal of the respective power semiconductor switch, and wherein a control signal is present at the control input of the switch.

13. The apparatus according to claim 12, further comprising: a gate-emitter monitoring device and a logic circuit connected downstream from the gate-emitter monitoring circuit, wherein a drive signal is present at a control input of the logic circuit, and a control signal for the active collector-emitter limiting circuit is present at a further control output of the active collector-emitter limiting circuit.

14. An apparatus for controlling a turn-off power converter valve having at least two turn-off, non-latching power semiconductor switches which are electrically connected in series, each of the conductor switches comprising a driver stage and an active collector-emitter limiting circuit which has a voltage detection device and a changeover switch, wherein a differential amplifier is provided as the active collector-emitter limiting circuit, wherein the voltage detection device is linked on an input side to a collector terminal of the respective semiconductor switch, wherein the voltage detection device is linked on an output side to an actual value input of the differential amplifier, wherein the differential amplifier is connected on the output side to a control input of the driver stage, wherein a reference input of the differential amplifier is connectable to two reference voltage sources using the changeover switch, and wherein a control signal is present at a control input of the changeover switch.

15. The apparatus according to claim 14, wherein a fading regulator is provided as the changeover switch.

16. The apparatus according to claim 14, further comprising a gate-emitter monitoring device and a logic circuit connected downstream from the gate-emitter monitoring circuit, wherein a drive signal is present at a control input of the logic circuit, and a further control signal for the active collector-emitter limiting circuit is present at a control output of the active collector-emitter limiting circuit.

17. An apparatus for controlling a turn-off power converter valve having at least two turn-off, non-latching power semiconductor switches which are electrically connected in series, each of the semiconductor switches comprising a driver stage and an active collector-emitter limiting circuit which has a voltage detection device, the voltage detection device being linked on an input side to a collector terminal of the respective semiconductor switch, the voltage detection device being linked on an output side to a control input of the driver stage, wherein a differential amplifier is provided as the active collector-emitter limiting circuit, wherein a reference input of the differential amplifier is linked to a reference voltage source, and wherein a controllable current source is connected on the output side to an actual value input of the differential amplifier.

18. The apparatus according to claim 17, further comprising a switch which connects the controllable current source on the output side to the actual value input of the differential amplifier, wherein a control signal is present at a control input of the switch.

19. The apparatus according to claim 17, further comprising a gate-emitter monitoring device and a logic circuit connected downstream from the gate-emitter monitoring circuit, wherein a drive signal is present at a control input of the logic circuit, and a control signal for the active collector-emitter limiting circuit is present at a control output of the active collector-emitter limiting circuit.

* * * * *

UNITED STATES PATENT AND TRADEMARK OFFICE
CERTIFICATE OF CORRECTION

PATENT NO. : 6,545,452 B2
DATED : April 8, 2003
INVENTOR(S) : Manfred Bruckmann et al.

It is certified that error appears in the above-identified patent and that said Letters Patent is hereby corrected as shown below:

Title page,
Item [56], References Cited, U.S. PATENT DOCUMENTS, add
-- 5,379,178    1/3/95    Graf et al. --;
FOREIGN PATENT DOCUMENTS, add
-- EP 0653830    5/17/95 --; and add
-- OTHER PUBLICATIONS
Gerster et al., "Fast High-power/High-voltage Switch Using Series-connected IGBTs with Active Gate controlled Voltage-balancing", Proceeding of Annual Power Electronics Conference and Exposition (APEC), IEEE, vol. Conf. 9, 1994, pp. 469-472.

Gediga et al., "High Power IGBT Converters with new Gate Drive and Protection Circuit", EPE 1995, pp. 1066-1077 --.

Signed and Sealed this

Fourth Day of April, 2006

JON W. DUDAS
*Director of the United States Patent and Trademark Office*